US012772719B2

(12) United States Patent
Liu et al.

(10) Patent No.: US 12,772,719 B2
(45) Date of Patent: Oct. 20, 2026

(54) DISPLAY APPARATUS AND MANUFACTURING METHOD THEREFOR

(71) Applicants: Chengdu BOE Optoelectronics Technology Co., Ltd., Chengdu (CN); BOE Technology Group Co., Ltd., Beijing (CN)

(72) Inventors: Chang Liu, Beijing (CN); Jiaxiang Wang, Beijing (CN); Xinqi Lin, Beijing (CN); Jie Yang, Beijing (CN); Yaqi Li, Beijing (CN); Binfeng Feng, Beijing (CN); Yanli Wang, Beijing (CN)

(73) Assignees: CHENGDU BOE OPTOELECTRONICS TECHNOLOGY CO., LTD., Chengdu (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 434 days.

(21) Appl. No.: 18/291,934

(22) PCT Filed: Jul. 4, 2022

(86) PCT No.: PCT/CN2022/103740

§ 371 (c)(1),
(2) Date: Jan. 25, 2024

(87) PCT Pub. No.: WO2023/005619

PCT Pub. Date: Feb. 2, 2023

(65) Prior Publication Data

US 2025/0098506 A1 Mar. 20, 2025

(30) Foreign Application Priority Data

Jul. 28, 2021 (CN) ........................ 202110856050.X

(51) Int. Cl.
*H10K 59/80* (2023.01)
*H10K 59/12* (2023.01)
*H10K 59/95* (2026.01)

(52) U.S. Cl.
CPC ..... *H10K 59/8794* (2023.02); *H10K 59/1201* (2023.02); *H10K 59/95* (2023.02)

(58) Field of Classification Search
CPC .... H10K 59/126; H10K 59/131; G09F 9/301; G09F 9/35; H10D 89/931; H10H 29/142; H10W 42/20
See application file for complete search history.

(56) References Cited

U.S. PATENT DOCUMENTS 10,593,899 B2 3/2020 Jung
10,897,021 B2 1/2021 Jung
(Continued)

FOREIGN PATENT DOCUMENTS

CN 104835804 A 8/2015
CN 107153296 A 9/2017
(Continued)

OTHER PUBLICATIONS

International Search Report and Written Opinion mailed on Oct. 9, 2022, in corresponding PCT/CN2022/103740, 15 pages.
(Continued)

*Primary Examiner* — Marc-Anthony Armand
(74) *Attorney, Agent, or Firm* — XSENSUS LLP

(57) ABSTRACT

A display apparatus, including: a display panel; a supporting layer, provided on a backlight side of the display panel; a circuit board, provided on a side of the supporting layer away from the display panel; and a shielding layer, overlaid on a side of the circuit board away from the display panel and including a first insulation layer and a conductive layer. The conductive layer includes a shielding portion and a
(Continued)

leading-out portion; the first insulation layer exposes at least partial region of the leading-out portion; an orthographic projection of the shielding portion on the display panel is located within an orthographic projection of the circuit board on the display panel; an orthographic projection of the leading-out portion on the display panel is located outside the orthographic projection of the circuit board on the display panel; the leading-out portion is electrically connected to the supporting layer.

20 Claims, 3 Drawing Sheets

(56) References Cited

U.S. PATENT DOCUMENTS

| | | | | |
|---|---|---|---|---|
| 11,270,635 | B2 | 3/2022 | Luo et al. | |
| 2019/0305234 | A1* | 10/2019 | Jung | G09G 3/3225 |
| 2020/0152896 | A1 | 5/2020 | Jung | |
| 2021/0104695 | A1 | 4/2021 | Jung | |
| 2021/0407389 | A1* | 12/2021 | Luo | G06F 1/1658 |

FOREIGN PATENT DOCUMENTS

| | | | |
|---|---|---|---|
| CN | 107369700 | A | 11/2017 |
| CN | 207301569 | U | 5/2018 |
| CN | 108415198 | A | 8/2018 |
| CN | 111462634 | A | 7/2020 |
| CN | 112435590 | A | 3/2021 |
| CN | 112909069 | A | 6/2021 |
| CN | 113053912 | A | 6/2021 |
| CN | 113594211 | A | 11/2021 |
| CN | 216133864 | U | 3/2022 |
| EP | 4006984 | A1 | 6/2022 |
| WO | 2021/016848 | A1 | 2/2021 |

OTHER PUBLICATIONS

Office Action issued on Jun. 22, 2024, in corresponding Chinese patent Application No. 202110856050.X, 16 pages.

* cited by examiner

DISPLAY APPARATUS AND MANUFACTURING METHOD THEREFOR

CROSS REFERENCE TO RELATED APPLICATIONS

The present disclosure is based upon International Application No. PCT/CN2022/103740, filed on Jul. 4, 2022, and claims priority to Chinese Patent Application No. 202110856050.X entitled "Display apparatus and manufacturing method therefor", filed on Jul. 28, 2021, and the entire contents of both of which are incorporated herein by reference.

TECHNICAL FIELD

The present disclosure relates to the field of display technology, and in particular, to a display panel and a manufacturing method therefor.

BACKGROUND

At present, in order to reduce the width of the frame of the display panel, the circuit board used for driving the display panel is usually provided on the back side of the display panel, so that the space for providing the circuit board on the edge of the display panel is omitted, and the width of the frame is reduced. However, since the circuit board is provided with a circuit including an electronic device and a wiring circuit, the circuit board is easily interfered by static electricity, thus affecting normal display.

It should be noted that the information disclosed in the above background part is only used to enhance the understanding of the background of the present disclosure, and therefore may include information that does not constitute the related art known to those of ordinary skill in the art.

SUMMARY

An object of the present disclosure is to provide a display apparatus and a manufacturing method therefor.

According to an aspect of the present disclosure, there is provided a display apparatus, including:

- a display panel;
- a supporting layer, provided on a backlight side of the display panel, where the supporting layer is made of a conductive material;
- a circuit board, provided on a side of the supporting layer away from the display panel and electrically connected to the display panel; and
- a shielding layer, overlaid on a side of the circuit board away from the display panel and including a first insulation layer and a conductive layer that are distributed along a direction away from the display panel; where the conductive layer includes a shielding portion and a leading-out portion that are electrically connected to each other, and the first insulation layer exposes at least partial region of the leading-out portion; an orthographic projection of the shielding portion on the display panel is located within an orthographic projection of the circuit board on the display panel, an orthographic projection of the leading-out portion on the display panel is located outside the orthographic projection of the circuit board on the display panel, and the leading-out portion is electrically connected to the supporting layer.

In some embodiments of the present disclosure, an orthographic projection of the first insulation layer on the display panel is located within the orthographic projection of the circuit board on the display panel;

- the orthographic projection of the leading-out portion on the display panel is located outside the orthographic projection of the first insulation layer on the display panel.

In some embodiments of the present disclosure, the circuit board includes:

- a substrate;
- a circuit layer, provided on a side of the substrate close to the display panel; where, the circuit layer is provided with an electrostatic export portion, and an orthographic projection of the electrostatic export portion on the display panel at least partially overlaps with an orthographic projection of the supporting layer on the display panel; and
- a protecting layer, covering the circuit layer and exposing the electrostatic export portion;
- where the electrostatic export portion is electrically connected to the supporting layer.

In some embodiments of the present disclosure, a material of the conductive layer includes at least one of a conductive adhesive or a conductive fabric.

In some embodiments of the present disclosure, the shielding layer further includes:

- a second insulation layer, provided on a surface of the conductive layer away from the display panel and covering the shielding portion and the leading-out portion.

In some embodiments of the present disclosure, the shielding layer further includes:

- a wave-absorbing layer, provided between the conductive layer and the first insulation layer; where an orthographic projection of the wave-absorbing layer on the display panel is located within an orthographic projection of the first insulation layer on the display panel, and a material of the wave-absorbing layer includes a wave-absorbing material capable of absorbing an electromagnetic wave.

In some embodiments of the present disclosure, the wave-absorbing material includes graphite.

In some embodiments of the present disclosure, the shielding layer further includes:

- a heat dissipation layer, provided between the wave-absorbing layer and the conductive layer, where an orthographic projection of the heat dissipation layer on the display panel is located within the orthographic projection of the first insulation layer on the display panel.

In some embodiments of the present disclosure, a material of the heat dissipation layer includes copper.

In some embodiments of the present disclosure, the display panel is provided with a display region and a peripheral region located outside the display region; the display panel includes a driving back plate and a light-emitting layer located on a side of the driving back plate, and the light-emitting layer is located in the display region;

the display apparatus further includes:

- a flexible connection circuit board, where an end of the flexible connection circuit board is stacked on a region, located in the peripheral region, of a surface of the driving back plate close to the light-emitting layer, and is electrically connected with the driving back plate; and another end of the flexible connection circuit board is bent to a side of the supporting layer away from the circuit board, and electrically connected with the circuit board.

In some embodiments of the present disclosure, a distance between the leading-out portion and the supporting layer is smaller than a distance between the shielding portion and the supporting layer.

In some embodiments of the present disclosure, the conductive layer located at the leading-out portion is directly attached to the supporting layer or electrically connected to the supporting layer through a conductive medium.

According to an aspect of the present disclosure, there is provided a method for manufacturing a display apparatus, including:

forming a display panel, a circuit board, and a shielding layer; where, the shielding layer includes a first insulation layer and a conductive layer located on a side of the first insulation layer; the conductive layer includes a shielding portion and a leading-out portion that are electrically connected to each other, and the first insulation layer exposes at least partial region of the leading-out portion;

forming a supporting layer on a backlight side of the display panel;

electrically connecting the circuit board to the display panel, and providing the circuit board on the backlight side of the display panel;

overlaying the shielding layer on a side of the circuit board away from the display panel, so that the first insulation layer and the conductive layer are distributed along a direction away from the display panel; where an orthographic projection of the shielding portion on the display panel is located within an orthographic projection of the circuit board on the display panel, and an orthographic projection of the leading-out portion on the display panel is located outside the orthographic projection of the circuit board on the display panel; and electrically connecting the leading-out portion to the supporting layer.

It should be understood that the above general description and the following detailed description are exemplary and explanatory only, and are not intended to limit the present disclosure.

BRIEF DESCRIPTION OF THE DRAWINGS

The accompanying drawings here, which are incorporated in and constitute a part of the description, illustrate embodiments consistent with the disclosure and together with the description serve to explain the principles of the disclosure. Obviously, the drawings in the following description are some embodiments of the present disclosure, and for those of ordinary skill in the art, other drawings can also be obtained from these drawings without creative efforts.

DETAILED DESCRIPTION

Figure 1:
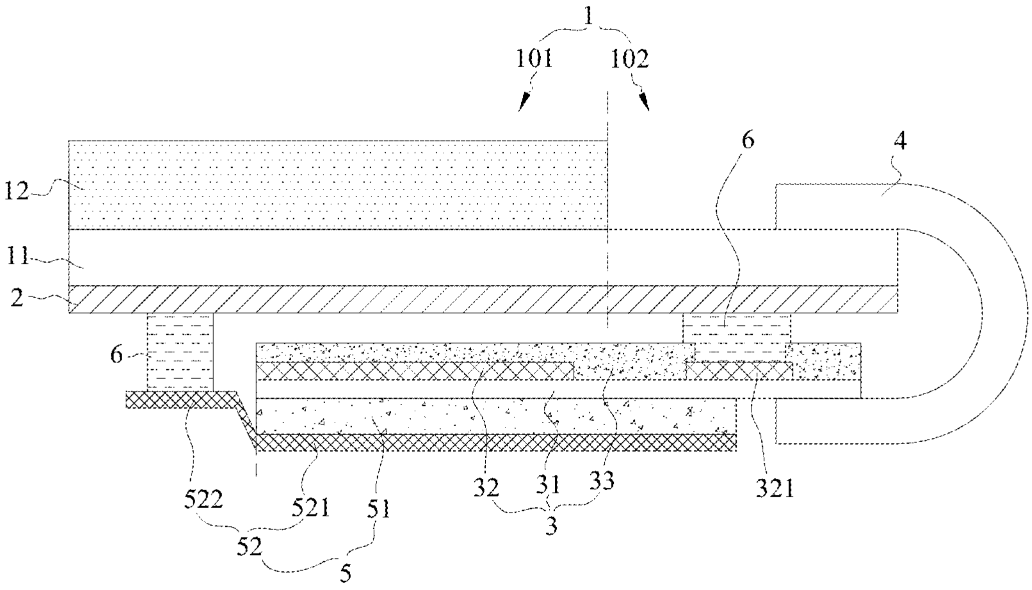
FIG. 1 is a schematic cross-sectional view of a display apparatus according to some embodiments of the present disclosure.

Example embodiments will now be described more fully with reference to the accompanying drawings. Example embodiments, however, can be implemented in various forms and should not be construed as limited to the embodiments set forth herein; by contrast, these embodiments are provided so that the present disclosure will be thorough and complete, and will fully convey the concept of example embodiments to those skilled in the art. The same reference numerals in the drawings denote the same or similar structures, and thus their detailed descriptions will be omitted. In addition, the drawings are merely schematic illustrations of the present disclosure, and are not necessarily drawn to scale.

The terms “a”, “an”, “the”, “said” and “at least one” are used to indicate the presence of one or more elements/components/etc.; the terms “comprising” and “including” are used to indicate an open inclusion and means that there may be additional elements/components/etc. in addition to the listed elements/components/etc.; the terms “first”, “second” and “third” etc. are only used as a marker, not a limitation on the number of its objects.

According to embodiments of the present disclosure, there is provided a display apparatus, which may be used for an electronic device having a display function, such as a mobile phone, a tablet computer, a television, or the like. As shown in FIG. 1 to FIG. 5, the display apparatus may include a display panel 1, a supporting layer 2, a circuit board 3, and a shielding layer 5.

The supporting layer 2 is provided on the backlight side of the display panel 1, and the supporting layer 2 is made of a conductive material.

The circuit board 3 is provided on a side of the supporting layer 2 away from the display panel 1, and is connected to the display panel 1.

The shielding layer 5 is overlaid on a side of the circuit board 3 away from the display panel 1, and includes a first insulation layer 51 and a conductive layer 52 that are distributed along a direction away from the display panel 1. The conductive layer 52 includes a shielding portion 521 and a leading-out portion 522 that are electrically connected to each other, and the first insulation layer 521 exposes at least partial region of the leading-out portion 522. The orthographic projection of the shielding portion 521 on the display panel 1 is located within the orthographic projection of the circuit board 3 on the display panel 1, the orthographic projection of the leading-out portion 522 on the display panel 1 is located outside the orthographic projection of the circuit board 3 on the display panel 1, and the leading-out portion 522 is electrically connected to the supporting layer 2.

According to the display apparatus of the embodiment of the present disclosure, the circuit board 3 is configured to drive the display panel 1 to emit light, so as to display an image. Since the shielding layer 5 is overlaid on the side of the circuit board 3 away from the display panel 1, the first insulation layer 51 is located between the conductive layer 52 and the circuit board 3, and the conductive layer 52 is electrically connected to the supporting layer 2, static electricity can be exported to the supporting layer 2 through the conductive layer 52, and the conducting path of static electricity from the outside of the display device to the circuit board 3 is blocked by the conductive layer 52 and the supporting layer 2, thus preventing interference of external static electricity on the circuit board 3, avoiding display abnormality caused by static electricity interference on the display apparatus, and ensuring the display effect. Meanwhile, since the leading-out portion 522 of the conductive layer 52 is located on the outside of the circuit board 3, and is opposite to the supporting layer 2, there is a relatively low requirement for alignment accuracy, which is convenient to install.

The structure for implementing the display function of the display apparatus in the present disclosure will be described in detail below.

As shown in FIG. 1, the display apparatus of the present disclosure may include a display panel 1 and a circuit board 3, the display panel 1 may emit light to a side, and the side away from the light-emitting direction is a backlight side. The display panel 1 may be a liquid crystal display panel, an organic light-emitting Diode (OLED) display panel or a Micro LED display panel, etc., which is not specifically limited here. The circuit board 3 is connected to the display panel 1 and is configured to drive the display panel 1 to emit light. In the present disclosure, it is taken that an OLED is used as an OLED display panel of a light-emitting device as an example for description.

The display panel 1 may include a driving back plate 11 and a light-emitting layer 12, and the light-emitting layer 12 is provided on a side of the driving back plate 11. The light-emitting layer 12 includes a plurality of light-emitting devices, and the side of the driving back plate 11 away from the light-emitting layer 12 is the backlight side of the display panel 1.

Figure 2:
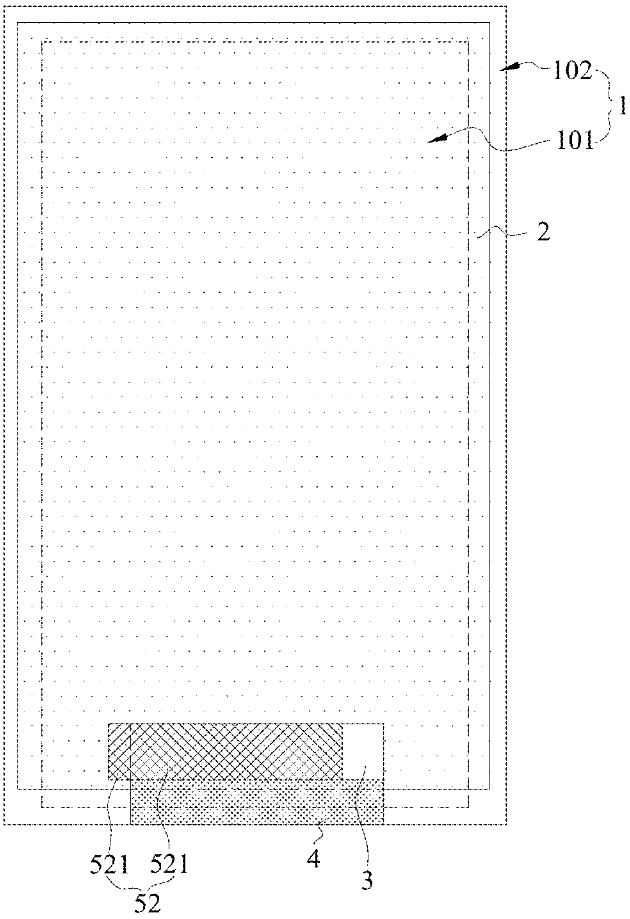
FIG. 2 is a schematic diagram of a backlight side of a display panel according to some embodiments of the present disclosure.

The driving back plate 11 may include a substrate and a driving circuit layer. The substrate is of a plate-like structure. The material of the substrate may be a hard material such as glass, or may be a soft material such as polyimide. The substrate is away from the light-emitting layer 12, and the driving circuit layer may be provided on a side of the substrate and includes a driving circuit. As shown in FIG. 1 and FIG. 2, the display panel 1 may be at least divided into a display region 101 and a peripheral region 102 located outside the display region 101. Correspondingly, the driving circuit layer may include a pixel circuit at least partially located within the display region 101 and a peripheral circuit located within the peripheral region 102. Among them, the pixel circuit may be a pixel circuit such as 6T1C, 6T2C, 7T1C, 7T2C, etc., as long as the light-emitting device can be driven to emit light, and the structure of the pixel circuit is not specifically limited here. The number of the pixel circuits is the same as the number of the light-emitting devices, and the pixel circuits are connected to the light-emitting devices in one-to-one correspondence, so as to respectively control each the light-emitting device to emit light. Among them, nTmC represents that a pixel circuit includes n transistors (represented by letter “T”) and m capacitors (represented by letter “C”).

The peripheral circuit is located in the peripheral region 102, and the peripheral circuit is connected to the pixel circuit and configured to input a driving signal to the pixel circuit, so as to control the light-emitting device to emit light. The peripheral circuit is connected to the pixel circuit, and includes a light-emitting control circuit, a gate driving circuit, a source driving circuit, and a power circuit, etc. The structure of the peripheral circuit is not specifically limited here.

The above driving circuit layer may include a plurality of thin film transistors and a capacitor, where the thin film transistor may be a top gate type thin film transistor or a bottom gate type thin film transistor. Each thin film transistor may include an active layer, a gate, a source, and a drain, where the gate may be a dual gate or a single gate. The active layer of each thin film transistor is provided on the same layer. The gates are provided on the same layer, and both the source and the drain are provided on the same layer, so as to simplify the process.

Taking the top gate type thin film transistor as an example, the driving circuit layer may include an active layer, a first gate insulation layer, a gate, a second gate insulation layer, an interlayer dielectric layer, a source and drain layer, and a flat layer. The active layer is provided on a side surface of the substrate, and the first gate insulation layer covers the active layer and the substrate; the gate is provided on the surface of the first gate insulation layer away from the substrate, and is opposite to the active layer; the second gate insulation layer covers the gate and the first gate insulation layer; the interlayer dielectric layer covers the second gate insulation layer; the source and drain layer is provided on the surface of the interlayer dielectric layer away from the substrate, and includes a source and a drain; the source and the drain are connected to two ends of the active layer through contact holes; and, the flat layer covers the source and drain layer and the interlayer dielectric layer. Certainly, the driving circuit layer may further include other film layers, as long as the light-emitting device can be driven to emit light, which is not described in detail here.

As shown in FIG. 1, the light-emitting layer 12 is provided on a side of the driving back plate 11. For example, the light-emitting layer 12 is provided on a surface of the flat layer away from the substrate. At least partial region of the light-emitting layer 12 is located within the range of the display region 101. The light-emitting layer 12 may include a plurality of light-emitting devices distributed in an array. For example, the light-emitting device is an OLED, and may include a first electrode, a light-emitting functional layer and a second electrode that are sequentially stacked along a direction away from the driving back plate 11.

The first electrode may be provided on a side of the flat layer away from the substrate and connected to a pixel circuit through a contact hole. The light-emitting functional layer may include a hole injection layer, a hole transport layer, a light-emitting material layer, an electron transport layer, and an electron injection layer that are sequentially stacked along a direction away from the driving back plate 11. The second electrode may cover the light-emitting functional layer, and extend to the peripheral region 102. The specific principle of the OLED to emit light will not be described in detail here.

In addition, in order to conveniently define the range of each light-emitting device, the light-emitting layer 12 may further include a pixel definition layer. The pixel definition layer may be provided together with the first electrode on the surface of the driving circuit layer away from the substrate, and provided with a plurality of openings exposing each first electrode in one-to-one correspondence. The light-emitting function layer is stacked on a region of the first electrode that is located within the opening. The light-emitting functional layers of each light-emitting device are spaced apart from each other. The light-emitting colors of different light-emitting functional layers may be different. The second electrode covers the light-emitting functional layer, so that each light-emitting device may share the same second electrode. Each light-emitting device may be defined by the above plurality of openings, and the boundary of any light-emitting device is the boundary of the light-emitting functional layer within the opening corresponding to the light-emitting device.

In some embodiments of the present disclosure, the light-emitting functional layer of each light-emitting device may belong to the same continuous light-emitting film layer. The light-emitting film layer covers each first electrode and the surface of the pixel definition layer away from the substrate simultaneously. The light-emitting film layer is located in the opening, the region of the light-emitting film layer stacked on the first electrode is the light-emitting functional layer of the light-emitting device, and the two adjacent light-emitting functional layers are connected to each other through other regions of the light-emitting film layer. That is, each light-emitting device may share the light-emitting film layer, so that the light-emitting color of each light-emitting device is the same. Correspondingly, in order to achieve color display, a color film layer may be provided on a side of the light-emitting layer 12 away from the driving back plate 11. The color film layer has a plurality of light-filtering portions, each light-filtering portion is provided in one-to-one correspondence with the light-emitting unit, and the colors of lights that may be transmitted through different light-filtering portions may be different, so that color display may be achieved through the color film layer matching with the light-emitting layer 12.

In addition, the display panel 1 may further include a encapsulation layer, which may be overlaid on the surface of the light-emitting layer 12 away from the driving back plate 11 and cover all the light-emitting devices, thus protecting the light-emitting layer 12 and preventing external water and oxygen from eroding the light-emitting devices. At the same time, the boundary of the encapsulation layer extends into the peripheral region 102, but does not exceed the peripheral region 102, and may protect the peripheral circuit of the peripheral region 102.

In some embodiments of the present disclosure, the encapsulation may be implemented by using thin-film encapsulation (TFE). The encapsulation layer may include a first inorganic layer, an organic layer, and a second inorganic layer. The first inorganic layer is overlaid on the surface of the light-emitting layer 12 away from the driving back plate 11, the organic layer may be provided on the surface of the first inorganic layer away from the driving back plate 11, and the boundary of the organic layer is defined on the inner side of the boundary of the first inorganic layer. The second inorganic layer covers the organic layer and the first inorganic layer that is not covered by the organic layer, thus blocking intrusion of water and oxygen through the second inorganic layer, and achieving planarization through the flexible organic layer.

In addition, the display panel 1 may further include a transparent cover plate, which may be overlaid on the side of the encapsulation layer away from the driving back plate 11; or, if the color film layer is present in the display panel 1, the transparent cover plate is overlaid on the side of the color film layer away from the driving back plate 11.

As shown in FIG. 1, in order to provide support for the display panel 1, especially for the flexible display panel 1 with the substrate of the flexible material, in order to prevent the display panel 1 from being damaged due to bending, the supporting layer 2 may be provided on the backlight side of the display panel 1. The supporting layer 2 may be attached to the display panel 1, and the material of the supporting layer 2 may be stainless steel or other materials having higher strength than the material of the display panel 1. The thickness of the supporting layer 2 is lower than the thickness of the display panel 1; and, if the display panel 1 is the flexible display panel 1, the supporting layer 2 can be bent along with the bending of the display panel 1.

Figure 6:
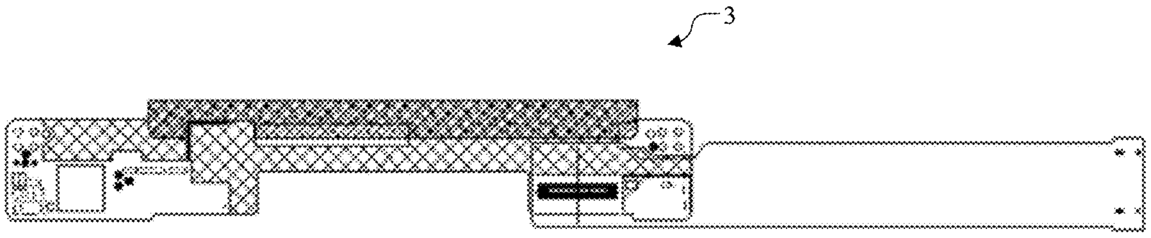
FIG. 6 is a schematic diagram of a circuit board in a display apparatus according to some embodiments of the present disclosure.

As shown in FIG. 1 and FIG. 6, the circuit board 3 may be connected to the display panel 1. Specifically, the circuit board 3 may be connected to the peripheral region 102 of the display panel 1, and input a signal to the peripheral circuit, so as to drive the display panel 1 to emit light. Meanwhile, the circuit board 3 may be provided on a side of the supporting layer 2 away from the display panel 1, and the orthographic projection of the circuit board 3 on the display panel 1 at least partially overlaps with the orthographic projection of the supporting layer 2 on the display panel 1. The circuit board 3 may be a flexible printed circuit 3 (FPC), or, may be other structures, which is not be specifically limited here.

In order to realize that the circuit board 3 is provided on the side of the supporting layer 2 away from the display panel 1 when the peripheral region 102 of the display panel 1 is connected to the circuit board 3, as shown in FIG. 1, in some embodiments of the present disclosure, a bonding region connected to the peripheral circuit is provided in the peripheral region 102, and the bonding region and the circuit board 3 are connected through the flexible connection circuit board 4, so as to realize the electrical connection between the circuit board 3 and the peripheral circuit. For example, the flexible connection circuit board 4 is a chip on film. The flexible connection circuit board 4 may be bent toward the backlight side of the display panel 1 while achieving electrical connection, so that the circuit board 3 may be located on the side of the supporting layer 2 away from the display panel 1. For example, as shown in FIG. 1, one end of the flexible connection circuit board 4 is stacked on a region of the surface of the driving back plate 11 close to the light-emitting layer 12, which is located in the peripheral region 102, is electrically connected to the bonding region of the driving back plate 11, and may be connected to the peripheral circuit through the bonding region. The end of the flexible connection circuit board 4 electrically connected to the driving back plate 11 may be located on the same surface of the driving back plate 11 as the light-emitting layer 12. The other end of the flexible connection circuit board 4 is bent to the side of the supporting layer 2 away from the circuit board 3, and is electrically connected to the circuit board 3, so as to electrically connect the circuit board 3 and the peripheral circuit.

Figure 3:
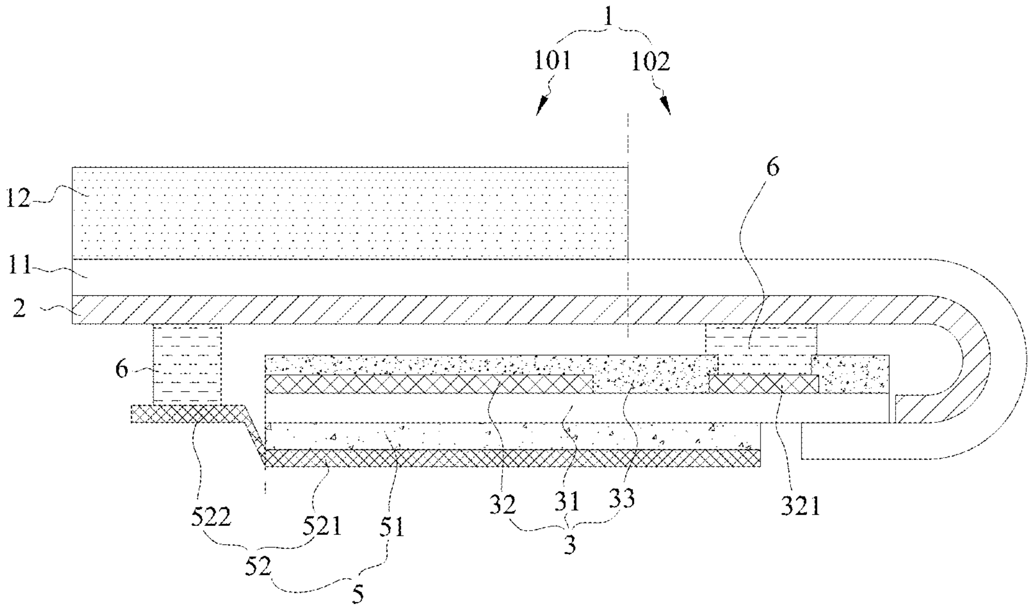
FIG. 3 is a schematic cross-sectional view of a display apparatus according to some embodiments of the present disclosure.

As shown in FIG. 3, in some other embodiments of the present disclosure, the substrate of the driving back plate 11 may be made of a flexible material, so that the driving back plate 11 is of a flexible structure. The peripheral region 102 is provided with a bonding region connected to the peripheral circuit, and the circuit board 3 may be directly electrically connected to the bonding region of the peripheral circuit. Since the driving back plate 11 has flexibility, at least the binding region may be bent toward the backlight side of the display panel 1, so that the circuit board 3 may be located on the side of the supporting layer 2 away from the display panel 1.

Certainly, in other embodiments of the present disclosure, the circuit board 3 may be electrically connected to the display panel 1 in other manners, as long as the circuit board 3 can be located on the side of the supporting layer 2 away from the display panel 1 while the electrical connection is realized.

As shown in FIG. 1, in some embodiments of the present disclosure, the circuit board 3 may include a substrate 31, a circuit layer 32, and a protecting layer 33.

The substrate 31 may be made of an insulating material, and for the flexible printed circuit 3, the substrate 31 may be made of a flexible material such as polyimide. The circuit layer 32 may be provided on the side of the substrate 31 close to the display panel 1, and the pattern of and the electronic device included in the circuit layer 32 are not specifically limited here. The protecting layer 33 may cover the circuit layer 32, and the protecting layer 33 is made of an insulating material to prevent the circuit layer 32 from contacting the outside.

The solution for implementing the electrostatic shielding function of the display panel 1 of the present disclosure will be described in detail below.

As shown in FIG. 1, in order to avoid interference to lines and electronic devices on the circuit board 3 caused by static electricity outside the display apparatus, the circuit board 3 can be covered from the side of the circuit board 3 away from the display panel 1 through the shielding layer 5, and the supporting layer 2 can be made of metal material such as stainless steel, so that the shielding layer 5 can be electrically connected to the supporting layer 2, thus conducting external static electricity to the supporting layer 2 without causing interference to the circuit board 3.

As shown in FIG. 1, the shielding layer 5 may include a first insulation layer 51 and a conductive layer 52.

The first insulation layer 51 is overlaid on at least partial region of the surface of the circuit board 3 away from the display panel 1; the material of the first insulation layer 51 may be a polyester material, such as polyimide, or, it may also be other insulating materials. The first insulation layer 51 may completely cover the circuit board 3, and may also only cover a partial region of the circuit board 3. Furthermore, in some embodiments of the present disclosure, the orthographic projection of the first insulation layer 51 on the display panel 1 is located within the orthographic projection of the circuit board 3 on the display panel 1; that is, the boundary of the first insulation layer 51 is limited by the boundary of the circuit board 3, and the boundary of the first insulation layer 51 is at most aligned with the boundary of the circuit board 3 without exceeding the boundary of the circuit board 3.

The conductive layer 52 is provided on the side of the first insulation layer 51 away from the display panel 1, and the conductive layer 52 can be separated from the circuit board 3 by the first insulation layer 51, thus avoiding that the circuit board 3 is short-circuited by the conductive layer 52 due to the fact that the circuit board 3 is electrically connected to the conductive layer 52. At the same time, the conductive layer 52 may be electrically connected to the supporting layer 2 to export external static electricity. Specifically, the conductive layer 52 may include a shielding portion 521 and a leading-out portion 522.

The orthographic projection of the shielding portion 521 on the display panel 1 is located within the orthographic projection of the circuit board 3 on the display panel 1; that is, the range of the shielding portion 521 does not exceed the boundary of the circuit board 3. Meanwhile, the boundary of the shielding portion 521 may be aligned with the boundary of the first insulation layer 51, or may be located within the boundary of the first insulation layer 51; that is, the first insulation layer 51 completely covers the shielding portion 521, thus avoiding that the shielding portion 521 is in direct contact with the circuit board 3, and preventing the circuit board 3 from being short-circuited due to the contact of the shielding portion 521 with the circuit board 3.

As shown in FIG. 1 and FIG. 2, the leading-out portion 522 is electrically connected to the shielding portion 521. The leading-out portion 522 and the shielding portion 521 may be different regions of the same continuous film layer, or may be independent structures electrically connected to each other. The orthographic projection of the leading-out portion 522 on the display panel 1 is located outside the orthographic projection of the circuit board 3 on the display panel 1; that is, the leading-out portion 522 extends out of the boundary of the circuit board 3. Meanwhile, the first insulation layer 51 exposes at least partial region of the leading-out portion 522; that is, at least partial region of the leading-out portion 522 is not covered by the first insulation layer 51. For example, the orthographic projection of the leading-out portion 522 on the display panel 1 may be located outside the orthographic projection of the first insulation layer 51 on the display panel 1; that is, the leading-out portion 522 is located outside the boundary of the first insulation layer 51 and not covered by the first insulation layer 51 at all. Alternatively, the first insulation layer 51 may cover the leading-out portion 522, but a through hole exposing the leading-out portion 522 may be formed in the first insulation layer 51, thus exposing partial region of the leading-out portion 522.

The material of the conductive layer 52 may be at least one of a conductive adhesive or a conductive fabric; the conductive adhesive may include a base material and conductive particles in the base material such as metal particles; and, the conductive fabric may be a conductive cloth. The conductive layer 52 may also adopt other materials as long as the conductive effect can be achieved.

The leading-out portion 522 not covered by the first insulation layer 51 may be electrically connected to the supporting layer 2 to form a path for conducting the electrostatic. Furthermore, in order to facilitate the connection, the leading-out portion 522 may be bent toward a direction close to the supporting layer 2, so that the distance between the leading-out portion 522 and the supporting layer 2 is less than the distance between the shielding portion 521 and the supporting layer 2, and the leading-out portion 522 may be directly attached to the supporting layer 2 to achieve electrical connection; or the leading-out portion 522 may be electrically connected to the supporting layer 2 through the conductive medium 6. For example, if the material of the conductive layer 52 is a conductive adhesive, the leading-out portion 522 may be directly bent toward the supporting layer 2, so that the leading-out portion 522 is attached and bonded to the supporting layer 2. If the material of the conductive layer 52 is a conductive cloth or other conductive material, the leading-out portion 522 may be electrically connected to the supporting layer 2 through the conductive medium 6, and the conductive medium 6 may be a conductive adhesive. No matter whether the leading-out portion 522 and the supporting layer 2 are electrically connected using the conductive medium 6, the leading-out portion 522 may be bent toward the supporting layer 2.

On the basis of shielding external static electricity through the shielding layer 5 in the above embodiments, static electricity inside the circuit board 3 can also be exported, thus preventing interference to the circuit board 3. Therefore, as shown in FIG. 1, in some embodiments of the present disclosure, the circuit layer 32 of the circuit board 3 may be electrically connected to the supporting layer 2, so as to export the static electricity generated inside the circuit board 3, thus further improving the electrostatic shielding effect. For example, the circuit layer 32 may have an electrostatic export portion 321, the orthographic projection of the electrostatic export portion 321 on the display panel 1 at least partially overlaps with the orthographic projection of the supporting layer 2 on the display panel 1, the protecting layer 33 exposes the electrostatic export portion 321, and the electrostatic export portion 321 may be electrically connected to the supporting layer 2 through the conductive medium 6, so as to export the static electricity in the circuit board 3. The pattern of the electrostatic export portion 321 is not specifically limited here, as long as the static electricity in the circuit board 3 can be exported.

The shielding layer 5 of the present disclosure may further include other film layers, and examples will be described below.

Figure 4:
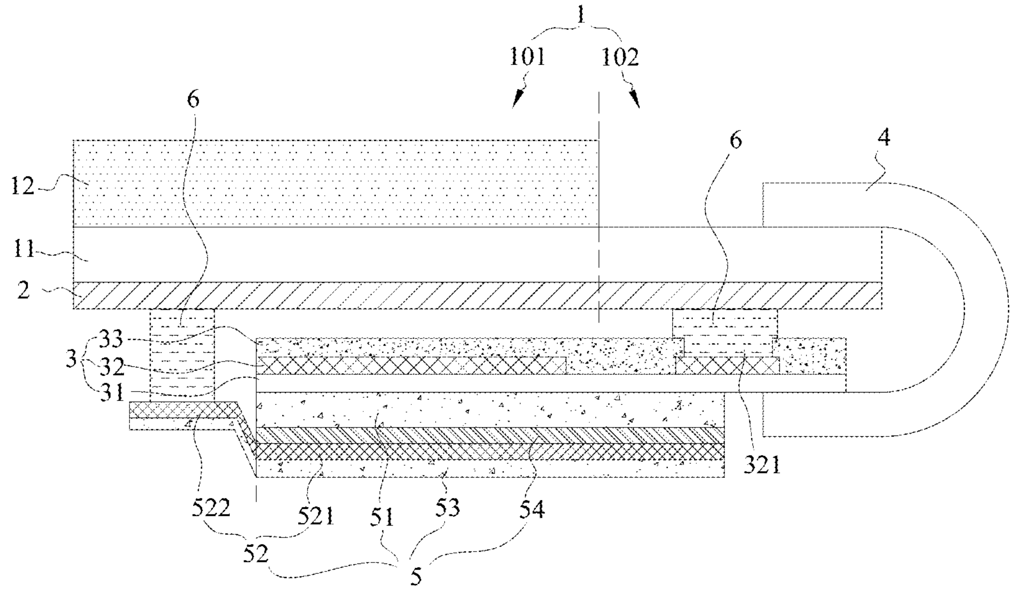
FIG. 4 is a schematic cross-sectional view of a display apparatus according to yet some embodiments of the present disclosure.
Figure 5:
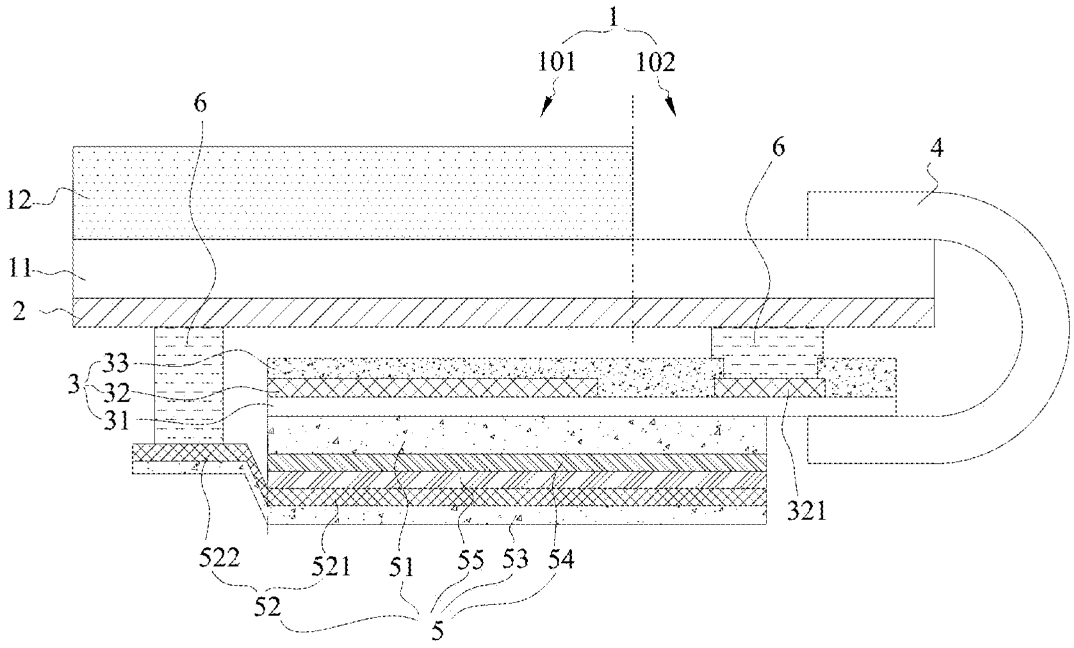
FIG. 5 is a schematic cross-sectional view of a display apparatus according to still some embodiments of the present disclosure.

As shown in FIG. 4 and FIG. 5, in some embodiments of the present disclosure, the shielding layer 5 further includes a second insulation layer 53, which may be provided on the surface of the conductive layer 52 away from the display panel 1 and cover the shielding portion 521 and the leading-out portion 522 to prevent the conductive layer 52 from contacting with the outside and achieve the effects of insulation and isolation. The boundary of the second insulation layer 53 may be aligned with the boundary of the conductive layer 52; that is, the orthographic projection of the second insulation layer 53 on the display panel 1 may overlap with the orthographic projection of the conductive layer 52 on the display panel 1.

As shown in FIG. 4, in some embodiments of the present disclosure, the shielding layer 5 may further include a wave-absorbing layer 54, which may be provided between the conductive layer 52 and the first insulation layer 51. The orthographic projection of the wave-absorbing layer 54 on the display panel 1 is located within the orthographic projection of the first insulation layer 51 on the display panel 1; that is, the boundary of the wave-absorbing layer 54 does not exceed the boundary of the first insulation layer 51, thus avoiding occlusion to the leading-out portion 522. At the same time, the material of the wave-absorbing layer 54 includes a wave-absorbing material capable of absorbing electromagnetic waves, so as to absorb electromagnetic waves that may interfere with the operation of the circuit board 3. For example, the wave-absorbing material may be graphite, or, may also be a material having similar functions such as silicon carbide and ferrite.

As shown in FIG. 5, in some embodiments of the present disclosure, the shielding layer 5 may further include a heat dissipation layer 55, which may be provided between the wave-absorbing layer 54 and the conductive layer 52. Heat generated by the circuit board 3 may be absorbed by the heat dissipation layer 55, and be conducted outward, thus preventing the temperature of the circuit board 3 from being too high. Meanwhile, the orthographic projection of the heat dissipation layer 55 on the display panel 1 is located within the orthographic projection of the first insulation layer 51 on the display panel 1, and the boundary of the heat dissipation layer 55 does not exceed the boundary of the first insulation layer 51, thus avoiding occlusion to the leading-out portion 522. The material of the heat dissipation layer 55 includes copper, or, may also be aluminum or other materials.

According to embodiments of the present disclosure, there is further provided a method for manufacturing a display apparatus, the display apparatus may be a display apparatus according to any of the above embodiments, and the structure of the display apparatus is not described in detail here. The manufacturing method may include steps S110 to S150.

In step S110, a display panel, a circuit board and a shielding layer are formed. The shielding layer includes a first insulation layer and a conductive layer located on a side of the first insulation layer. The conductive layer includes a shielding portion and a leading-out portion that are electrically connected to each other. The first insulation layer exposes at least partial region of the leading-out portion.

In step S120, a supporting layer is formed on the backlight side of the display panel.

In step S130, the circuit board is connected to the display panel, and the circuit board is provided on the backlight side of the display panel.

In step S140, the shielding layer is overlaid on a side of the circuit board away from the display panel, so that the first insulation layer and the conductive layer are distributed along a direction away from the display panel. The orthographic projection of the shielding portion on the display panel is located within the orthographic projection of the circuit board on the display panel, and the orthographic projection of the leading-out portion on the display panel is located outside the orthographic projection of the circuit board on the display panel.

In step S150, the leading-out portion is electrically connected to the supporting layer.

The specific structure and beneficial effects of the display apparatus involved in the above steps have been described in detail in the embodiments of the above display apparatus, and details are not described here again.

It should be noted that, although the various steps of the manufacturing method in the present disclosure are described in a specific order in the drawings, however, this does not require or imply that these steps must be performed in this specific order, or that all of the illustrated steps must be performed to achieve the desired results. Additionally or alternatively, some steps may be omitted, a plurality of steps may be combined into one step to be performed, and/or one step may be decomposed into a plurality steps to be performed, etc.

Other embodiments of the present disclosure will be apparent to those skilled in the art from consideration of the specification and practice of the present disclosure. The present disclosure is intended to cover any variations, uses, or adaptations of the present disclosure following the general principles of the present disclosure and including common general knowledge or conventional technical means in the art not disclosed in the present disclosure. The specification and embodiments may be considered as examples only, with a true scope and spirit of the disclosure being indicated by the appended claims.

What is claimed is:

1. A display apparatus, comprising:

a display panel;

a supporting layer, provided on a backlight side of the display panel, wherein the supporting layer is made of a conductive material;

a circuit board, provided on a side of the supporting layer away from the display panel and electrically connected to the display panel; and a shielding layer, overlaid on a side of the circuit board away from the display panel and comprising a first insulation layer and a conductive layer that are distributed along a direction away from the display panel; wherein the conductive layer comprises a shielding portion and a leading-out portion that are electrically connected to each other, and the first insulation layer exposes at least partial region of the leading-out portion; an orthographic projection of the shielding portion on the display panel is located within an orthographic projection of the circuit board on the display panel, an orthographic projection of the leading-out portion on the display panel is located outside the orthographic projection of the circuit board on the display panel, and the leading-out portion is electrically connected to the supporting layer.

2. The display apparatus according to claim 1, wherein an orthographic projection of the first insulation layer on the display panel is located within the orthographic projection of the circuit board on the display panel; and the orthographic projection of the leading-out portion on the display panel is located outside the orthographic projection of the first insulation layer on the display panel.

3. The display apparatus according to claim 1, wherein the circuit board comprises:

a substrate;

a circuit layer, provided on a side of the substrate close to the display panel; wherein, the circuit layer is provided with an electrostatic export portion, and an orthographic projection of the electrostatic export portion on the display panel at least partially overlaps with an orthographic projection of the supporting layer on the display panel; and a protecting layer, covering the circuit layer and exposing the electrostatic export portion;

wherein the electrostatic export portion is electrically connected to the supporting layer.

4. The display apparatus according to claim 1, wherein a material of the conductive layer comprises at least one of a conductive adhesive or a conductive fabric.

5. The display apparatus according to claim 1, wherein the shielding layer further comprises:

a second insulation layer, provided on a surface of the conductive layer away from the display panel and covering the shielding portion and the leading-out portion.

6. The display apparatus according to claim 1, wherein the shielding layer further comprises:

a wave-absorbing layer, provided between the conductive layer and the first insulation layer; wherein an orthographic projection of the wave-absorbing layer on the display panel is located within an orthographic projection of the first insulation layer on the display panel, and a material of the wave-absorbing layer comprises a wave-absorbing material capable of absorbing an electromagnetic wave.

7. The display apparatus according to claim 6, wherein the wave-absorbing material comprises graphite.

8. The display apparatus according to claim 6, wherein the shielding layer further comprises:

a heat dissipation layer, provided between the wave-absorbing layer and the conductive layer, wherein an orthographic projection of the heat dissipation layer on the display panel is located within the orthographic projection of the first insulation layer on the display panel.

9. The display apparatus according to claim 8, wherein a material of the heat dissipation layer comprises copper.

10. The display apparatus according to claim 2, wherein the display panel is provided with a display region and a peripheral region located outside the display region; the display panel comprises a driving back plate and a light-emitting layer located on a side of the driving back plate, and the light-emitting layer is located in the display region;

the display apparatus further comprises:

a flexible connection circuit board, wherein an end of the flexible connection circuit board is stacked on a region, located in the peripheral region, of a surface of the driving back plate close to the light-emitting layer, and is electrically connected with the driving back plate; and another end of the flexible connection circuit board is bent to a side of the supporting layer away from the circuit board, and electrically connected with the circuit board.

11. The display apparatus according to claim 10, wherein a distance between the leading-out portion and the supporting layer is smaller than a distance between the shielding portion and the supporting layer.

12. The display apparatus according to claim 11, wherein the conductive layer located at the leading-out portion is directly attached to the supporting layer.

13. A method for manufacturing a display apparatus, comprising:

forming a display panel, a circuit board, and a shielding layer; wherein, the shielding layer comprises a first insulation layer and a conductive layer located on a side of the first insulation layer; the conductive layer comprises a shielding portion and a leading-out portion that are electrically connected to each other, and the first insulation layer exposes at least partial region of the leading-out portion;

forming a supporting layer on a backlight side of the display panel;

electrically connecting the circuit board to the display panel, and providing the circuit board on the backlight side of the display panel;

overlaying the shielding layer on a side of the circuit board away from the display panel, so that the first insulation layer and the conductive layer are distributed along a direction away from the display panel; wherein an orthographic projection of the shielding portion on the display panel is located within an orthographic projection of the circuit board on the display panel, and an orthographic projection of the leading-out portion on the display panel is located outside the orthographic projection of the circuit board on the display panel; and electrically connecting the leading-out portion to the supporting layer.

14. The display apparatus according to claim 2, wherein the shielding layer further comprises:

a second insulation layer, provided on a surface of the conductive layer away from the display panel and covering the shielding portion and the leading-out portion.

15. The display apparatus according to claim 3, wherein the shielding layer further comprises:

a second insulation layer, provided on a surface of the conductive layer away from the display panel and covering the shielding portion and the leading-out portion.

16. The display apparatus according to claim 4, wherein the shielding layer further comprises:

a second insulation layer, provided on a surface of the conductive layer away from the display panel and covering the shielding portion and the leading-out portion.

17. The display apparatus according to claim 2, wherein the shielding layer further comprises:

a wave-absorbing layer, provided between the conductive layer and the first insulation layer; wherein an orthographic projection of the wave-absorbing layer on the display panel is located within an orthographic projection of the first insulation layer on the display panel, and a material of the wave-absorbing layer comprises a wave-absorbing material capable of absorbing an electromagnetic wave.

18. The display apparatus according to claim 3, wherein the shielding layer further comprises:

a wave-absorbing layer, provided between the conductive layer and the first insulation layer; wherein an orthographic projection of the wave-absorbing layer on the display panel is located within an orthographic projection of the first insulation layer on the display panel, and a material of the wave-absorbing layer comprises a wave-absorbing material capable of absorbing an electromagnetic wave.

19. The display apparatus according to claim 4, wherein the shielding layer further comprises:

a wave-absorbing layer, provided between the conductive layer and the first insulation layer; wherein an orthographic projection of the wave-absorbing layer on the display panel is located within an orthographic projection of the first insulation layer on the display panel, and a material of the wave-absorbing layer comprises a wave-absorbing material capable of absorbing an electromagnetic wave.

20. The display apparatus according to claim 11, wherein the conductive layer located at the leading-out portion is electrically connected to the supporting layer through a conductive medium.

* * * * *